US007960909B2

(12) United States Patent
Amano et al.

(10) Patent No.: US 7,960,909 B2
(45) Date of Patent: Jun. 14, 2011

(54) LIGHT-EMITTING DEVICE, METHOD FOR PRODUCING THE SAME AND FLUORESCENT DEVICE

(75) Inventors: Akio Amano, Kawasaki (JP); Hiroki Iwanaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 615 days.

(21) Appl. No.: 11/685,416

(22) Filed: Mar. 13, 2007

(65) Prior Publication Data

US 2007/0228932 A1 Oct. 4, 2007

(30) Foreign Application Priority Data

Mar. 14, 2006 (JP) .................................. 2006-069066

(51) Int. Cl.
*H05B 33/04* (2006.01)
*H01L 33/00* (2010.01)
(52) U.S. Cl. .......... 313/504; 313/502; 313/503; 257/98; 257/100
(58) Field of Classification Search .......... 313/502–504; 428/690–691; 257/98, 100
See application file for complete search history.

(56) References Cited

U.S. PATENT DOCUMENTS

| | | | | |
|---|---|---|---|---|
| 5,998,925 A * | 12/1999 | Shimizu et al. | .............. | 313/503 |
| 6,291,132 B1 * | 9/2001 | Glushko et al. | .......... | 430/270.15 |
| 6,340,824 B1 * | 1/2002 | Komoto et al. | .................. | 257/99 |
| 2003/0122482 A1 * | 7/2003 | Yamanaka et al. | ............ | 313/512 |
| 2003/0133307 A1 * | 7/2003 | Sugihara et al. | .............. | 362/490 |
| 2004/0183085 A1 * | 9/2004 | Okazaki | .......................... | 257/98 |
| 2004/0263074 A1 * | 12/2004 | Baroky et al. | ................ | 313/512 |
| 2004/0265631 A1 * | 12/2004 | Iwanaga et al. | ............... | 428/690 |
| 2005/0212397 A1 * | 9/2005 | Murazaki et al. | ............. | 313/487 |
| 2006/0099449 A1 | 5/2006 | Amano et al. | | |
| 2006/0214578 A1 | 9/2006 | Iwanaga et al. | | |
| 2006/0220531 A1 * | 10/2006 | Tokunaga et al. | ............. | 313/501 |
| 2007/0007884 A1 | 1/2007 | Iwanaga et al. | | |

FOREIGN PATENT DOCUMENTS

| | | |
|---|---|---|
| JP | 2000-031531 | 1/2000 |
| JP | 2002-203991 | 7/2002 |
| JP | 2004-356358 | 12/2004 |
| JP | 2005-015564 | 1/2005 |

* cited by examiner

*Primary Examiner* — Nimeshkumar D Patel
*Assistant Examiner* — Steven Horikoshi
(74) *Attorney, Agent, or Firm* — Turocy & Watson, LLP (57) ABSTRACT

A light-emitting device assured of high reliability, high efficiency and high color rendering, is provided. The light-emitting device includes a frame, an LED chip provided on the frame, and a fluorescent layer containing an inorganic fluorescent material and an organic fluorescent material and being provided on the LED chip. In the fluorescent layer, the concentration of the inorganic fluorescent material is decreased toward the top from the bottom of the fluorescent layer, and the concentration of the organic fluorescent material is decreased toward the bottom from the top of the fluorescent layer.

7 Claims, 5 Drawing Sheets

LIGHT-EMITTING DEVICE, METHOD FOR PRODUCING THE SAME AND FLUORESCENT DEVICE

The present application is based upon and claims the benefit of priority from Japanese Patent Application No. JP2006-69266 filed on Mar. 14, 2006, the entire disclosure of which is incorporated herein by reference.

BACKGROUND OF THE INVENTION i) Field of the Invention

The present invention relates to a light-emitting device, a method for producing the same, and a fluorescent device. More specifically, the present invention relates to a light-emitting device using an organic fluorescent material and the like, a method for the producing the same, and a fluorescent pattern-formed device.

ii) Related Art

In the illumination market, from the aspect of diversification of usage or use environment, requirement for design property, and environmental consciousness, LED is increasingly expected as a new light source. The emission efficiency of LED using an inorganic fluorescent material in the fluorescent layer is being drastically enhanced at present and is estimated to eventually surpass the emission efficiency of a fluorescent lamp. However, in the case of using LED for a lighting system, depending on the usage, excellent characteristics are required not only in the emission efficiency but also in the color rendering.

As for the current white LED system, a combination of a blue light-emitting part (LED portion) and a yellow light-emitting fluorescent material is predominating. However, in such a combination, the light emission of the red component is weak and the red color rendering can be hardly increased.

In order to solve this problem, a method of adding a red fluorescent material may be considered, but under present circumstances, the characteristics of the inorganic red fluorescent material are not necessarily satisfied and a white light-emitting LED comprising only an inorganic fluorescent material having added thereto an inorganic red fluorescent material cannot obtain sufficiently high light emission intensity.

On the other hand, it has been proposed to use an organic fluorescent material as the red fluorescent material for LED (see, JP-A-2005-15564). From this organic fluorescent material, red light with high light emission intensity can be obtained. In the case of intending to produce a white LED device by using such an organic fluorescent material as the red fluorescent material, an inorganic fluorescent material needs to be used in combination to realize white color, because as for the light emission other than red color, satisfactory characteristics are not obtained at present by an organic fluorescent material.

For example, there has been proposed a light-emitting device obtained by disposing a stacked body in which a layer comprising an inorganic fluorescent material and a layer comprising a fluorescent material containing a rare earth ion complex (inorganic fluorescent material) are separated from each other, such that the layer comprising an inorganic fluorescent material is positioned closer to the semiconductor light-emitting element (see, JP-A-2004-356358). According to this light-emitting device, it is indicated that the problem of accelerated deterioration of the rare earth complex resulting from local heating of the rare earth ion complex-containing fluorescent layer due to heat generated by light emission of the semiconductor light-emitting element can be prevented.

However, in a light-emitting device comprising such a stack-type fluorescent layer, there may arise separation due to poor adhesion, difference in the thermal expansion coefficient, or the like among a plurality of fluorescent layers. Also, due to difference in the refractive index, fluctuation of the interface state, or the like among a plurality of fluorescent layers, the light extraction efficiency may decrease.

As a matter of course, in the case of using a fluorescent layer comprising only an organic fluorescent material (e.g., rare earth ion complex) as the fluorescent material, there is a problem that the heat generated by light emission of the semiconductor light-emitting element causes local heating of the fluorescent layer and this accelerates deterioration of the organic fluorescent material.

As described above, in a light-emitting device where a semiconductor light-emitting element is provided by stacking an inorganic fluorescent layer and an organic fluorescent layer, separation may arise due to poor adhesion, difference in the thermal expansion coefficient, or the like among a plurality of fluorescent layers, or the light extraction efficient may decrease due to difference in the refractive index, fluctuation of the interface state, or the like among a plurality of fluorescent layers, and the reliability is low.

Also, in the case of using a fluorescent layer comprising only an organic fluorescent material as the fluorescent material, since the fluorescent layer is locally heated due to heat generated by light emission of the semiconductor light-emitting element, deterioration of the organic fluorescent material is accelerated.

SUMMARY OF THE INVENTION

An object of an illustrative, non-limiting embodiment of the present invention is to provide a light-emitting device assured of high reliability, high efficiency and high color rendering, a production method thereof, and a fluorescent device.

According to an aspect of the present invention, there is provided a light-emitting device comprising: a support; a light-emitting part; and a fluorescent layer comprising a matrix polymer, an organic fluorescent material, and an inorganic fluorescent material, wherein a lowermost surface of the fluorescent layer lies closer to the light-emitting part than an uppermost surface of the fluorescent layer, and wherein the fluorescent layer has a concentration of the inorganic fluorescent material which is decreased toward the uppermost surface from the lowermost surface of the fluorescent layer, and the fluorescent layer has a concentration of the organic fluorescent material which is decreased toward the lowermost surface from the uppermost surface of the fluorescent layer.

According to an aspect of the present invention, there is provided a method for producing a light-emitting device comprising a support, a light-emitting part, and a fluorescent layer comprising an organic fluorescent material and an inorganic fluorescent material, the method comprising: dispersing the inorganic fluorescent material in a resin raw material to provide a dispersion liquid; supplying the dispersion liquid onto the light-emitting part and polymerizing the resin raw material under heating to form a resin layer comprising the inorganic fluorescent material; and supplying a solution, which has an organic fluorescent material dissolved therein, on the resin layer so that the solution penetrates into the resin layer.

According to an aspect of the present invention, there is provided a light-emitting device comprising: a support; a light-emitting part; and a fluorescent layer comprising an organic fluorescent material, wherein a lowermost surface of the fluorescent layer lies closer to the light-emitting part than an uppermost surface of the fluorescent layer, and wherein the fluorescent layer has a concentration of the organic fluorescent material which is decreased toward the lowermost surface from the uppermost surface of the fluorescent layer.

According to an aspect of the present invention, there is provided a fluorescent device comprising: a support; and a fluorescent layer comprising an organic fluorescent material and an inorganic fluorescent material, wherein the fluorescent layer has a concentration of the inorganic fluorescent material which is decreased toward an uppermost surface from a lowermost surface of the fluorescent layer, the fluorescent layer has a concentration of the organic fluorescent material which is decreased toward the lowermost surface from the uppermost surface of the fluorescent layer, and the organic fluorescent material is dispersed in an in-plane pattern configuration.

According to an aspect of the present invention, there is provided a fluorescent device comprising: a support; and a fluorescent layer comprising an organic fluorescent material, wherein the fluorescent layer has a concentration of the organic fluorescent material which is decreased toward a lowermost surface from an uppermost surface of the fluorescent layer, and the organic fluorescent material is dispersed in an in-plane pattern configuration.

DETAILED DESCRIPTION OF THE INVENTION

According to an aspect of the present invention, a light-emitting device assured of high reliability, high efficiency and high color rendering, a production method thereof, and a fluorescent pattern-formed device can be provided.

Embodiments of the present invention are described in detail below by referring to the drawings.

First Embodiment

Figure 1:
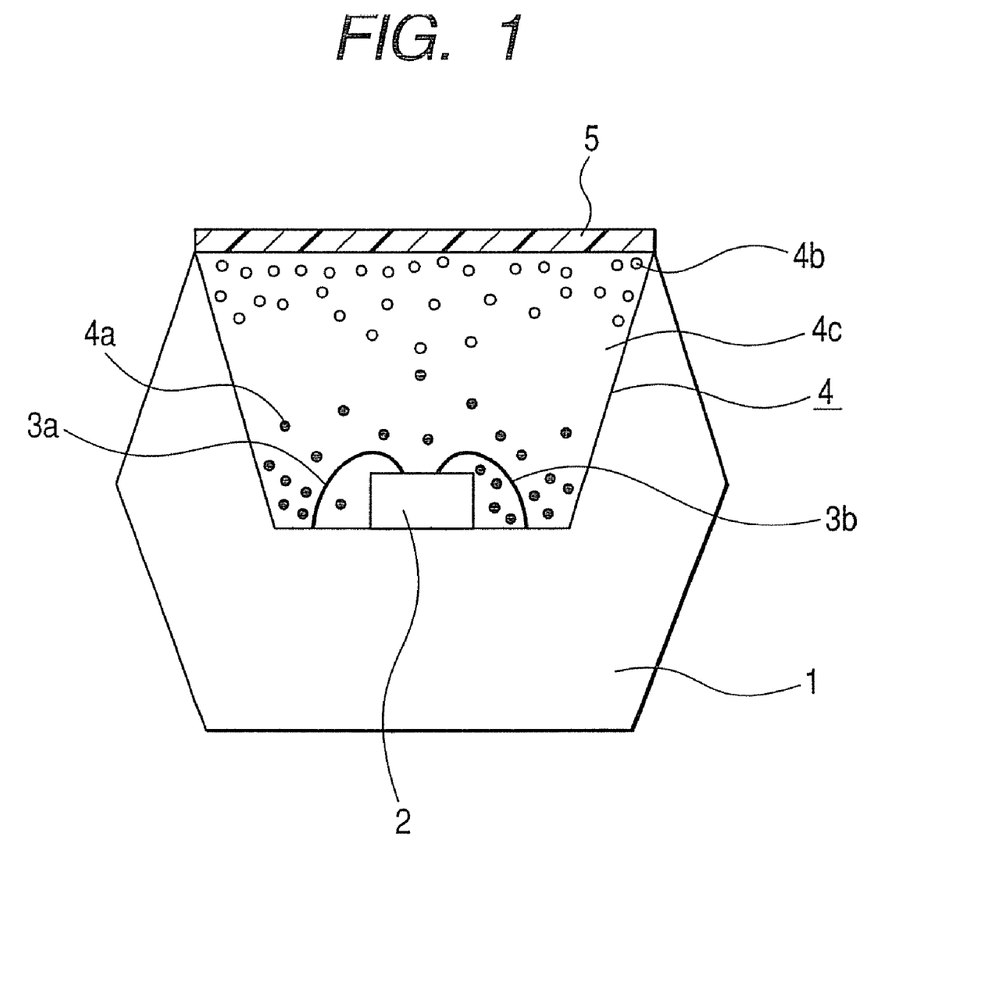
FIG. 1 is a cross-sectional view showing a light-emitting device according to a first exemplary embodiment of the present invention.

FIG. 1 is a cross-sectional view showing a light-emitting device according to a first exemplary embodiment. A light-emitting device (hereinafter, sometimes referred to as "a LED device") shown in FIG. 1 comprises LED as the light-emitting part and a fluorescent layer. More specifically, as shown in FIG. 1, an LED chip as a light-emitting part 2 is arranged within a recess of an LED frame (support) 1. This LED chip 2 includes, for example, a GaN-based semiconductor material, and the emission wavelength as a UV light source is, for example, 395 nm. The light-emitting part 2 is not limited only to an LED chip, but, for example, an ultraviolet light-emitting element such as laser diode may be used. Incidentally, a pair of electrodes (not shown) are provided to the LED chip 2, and these electrodes are electrically connected to exterior connection terminals by wires 3a and 3b, respectively.

Within the recess of the LED frame 1, a fluorescent layer 4 is provided on the LED chip 2 and formed to occupy the recess of the LED frame 1. The fluorescent layer 4 includes a matrix polymer 4c having dispersed therein an inorganic fluorescent material 4a and an organic fluorescent material 4b. The inorganic fluorescent material 4a in the matrix polymer 4c is dispersed and adjusted so that the abundance ratio can decrease toward an uppermost surface (the top) from an lowermost surface (the bottom) of the fluorescent layer 4 along the thickness direction of the fluorescent layer 4. Also, the organic fluorescent material 4b in the matrix polymer 4c is dispersed and adjusted so that the abundance ratio can decreased toward the bottom from the top of the fluorescent layer 4 along the thickness direction. A moisture-proof layer 5 is provided on the top of the fluorescent layer 4 and by virtue of this, the moisture resistance can be enhanced. Examples of the material usable for the moisture-proof layer 5 include a fluororesin such as PCTFE (polychlorotrifluoroethylene), PTFE (polytetrafluoroethylene) and PVdF (polyvinylidene fluoride), and a ceramic nanoparticle-deposited film (this is obtained by vapor-depositing a ceramic nanoparticle on a film formed of a resin or the like).

As for the matrix polymer 4c, for example, a silicone resin may be used. A silicone resin is preferred, but the matrix polymer may also be selected from other materials such as a rubber (e.g., silicone rubber, fluororubber, acryl rubber), an elastomer (e.g., polyolefin, polyester, polyamide, polystyrene, polyurethane), and a gel (e.g., acrylamide gel, methacrylate-based gel, polyvinylpyrrolidone). In practice, a material transparent in the visible wavelength region is preferred.

As for the inorganic fluorescent material 4a, for example, an inorganic fluorescent material capable of emitting yellow light, such as YAG:Ce and $(Sr, Ba)_2SiO_4$:Eu, an inorganic fluorescent material capable of emitting green light, such as InGaN, $LaPO_4$:Ce, Tb and $BaMgAl_{10}O_{17}$:Eu, Mn, and an inorganic fluorescent material capable of emitting blue light, such as InGaN, $BaMgAl_{10}O_{17}$:Eu and ZnSe may be used. Also, as for the organic fluorescent material 4b, for example, a rare earth complex having a structure shown by the following formula (1) may be used.

Formula (1):

wherein Ln is a rare earth atom, $R_7$ and $R_9$, which may be the same or different, each is selected from the group consisting of a linear or branched alkyl or alkoxy group, a phenyl group, a biphenyl group, a naphthyl group, a heterocyclic group, and a substitution product thereof, and $R_8$ is a halogen atom, a heavy hydrogen atom, or a linear or branched aliphatic group having a carbon number of 1 to 22.

The rare earth complex 4b is preferably represented by the following formula (2):

wherein Ln is a rare earth atom; X and Y, which may be the same or different, each is an atom selected from the group consisting of O, S and Se; $R_1$ to $R_6$, which may be the same of different, each is selected from the group consisting of a linear or branched alkyl or alkoxy group having a carbon number of 20 or less, a phenyl group, a biphenyl group, a naphthyl group, a heterocyclic group, and a substitution product thereof, and the combination of $R_1$ to $R_3$ and the combination of $R_4$ to $R_6$ may be the same or different but is preferably different in view of increase in the light emission intensity; $R_7$ and $R_9$, which may be the same or different, each is selected from the group consisting of a linear or branched alkyl or alkoxy group, a phenyl group, a biphenyl group, a naphthyl group, a heterocyclic group and a substitution product thereof; and $R_8$ is a halogen atom, a heavy hydrogen atom, or a linear or branched aliphatic group having a carbon number of 1 to 22.

The rare earth atom Ln may be selected from europium, terbium, iridium and erbium. The rare earth atom is preferably europium, because red light emission of which high brightness is unachievable by currently available fluorescent materials for LED can be realized with high efficiency. That is, a complex represented by the following formula (3) is preferred. When an europium complex of such a structure has an asymmetric structure, light emission with high efficiency can be obtained.

Formula (3):

wherein X, Y and $R_1$ to $R_9$ are the same as above.

Hereinafter, the concentration distribution of the organic and inorganic fluorescent materials in the fluorescent layer will be described in detail.

In the case of a general LED device, the thickness of the fluorescent layer is about 1 mm and the height of the LED chip light source is about 150 μm. The presence in a high concentration of an organic fluorescent material in the vicinity of the LED chip light source is not preferred in view of durability, and it is demanded that the concentration in the vicinity of the light source is low. In this meaning, in the case of the above-described general LED device, the concentration of the organic fluorescent material (e.g., Eu complex) in the region of 20% with respect to the thickness of the fluorescent layer from the chip light source side is preferably 20% or less, more preferably 10% or less, relative to the concentration in the vicinity of the fluorescent layer surface opposite the chip light source (i.e., the uppermost surface (the top) of the fluorescent layer).

On the other hand, the concentration of the inorganic fluorescent material in the region of 20% with respect to the thickness of the fluorescent layer from the fluorescent layer surface side opposite the chip light source (i.e., the uppermost surface (the top) of the fluorescent layer) is preferably 20% or less, relative to the concentration in the lowermost surface of the fluorescent layer on the chip light source side.

In such a fluorescent material concentration profile with respect to the thickness direction, the optimal state varies depending on the thickness or shape of the fluorescent layer, but the relative concentration of the organic fluorescent material within 50 μm in the vicinity of the light source (i.e., the concentration of the organic fluorescent material within 50 μm from the lowermost surface of the fluorescent layer relative to the concentration in the uppermost surface of the fluorescent layer) is preferably 20% or less, more preferably 10% or less.

In the case where the fluorescent layer has a sufficiently large thickness, a fluorescent layer allowing for localization of the organic fluorescent material in a high concentration on the fluorescent layer surface can be realized.

According to this embodiment, a light-emitting device assured of high reliability, high brightness and high color rendering can be realized. More specifically, an organic fluorescent material and an inorganic fluorescent material can be made to coexist in the same fluorescent layer, so that issues in the light-emitting device of the type of stacking a plurality of fluorescent layers, namely, issues such as possibility of causing separation due to poor adhesion, difference in the thermal expansion coefficient, or the like among a plurality of fluorescent layers, or reduction in the light extraction efficiency due to difference in the refractive index, fluctuation of the interface state, or the like among fluorescent layers, can be improved. Also, an organic fluorescent material capable of emitting red light can be effectively used and a white LED with high color rendering unachievable only by an inorganic fluorescent material can be realized.

Furthermore, in the same fluorescent layer, the concentration of the inorganic fluorescent material is low in the region where the organic fluorescent material is distributed in a high concentration, and the concentration of the organic fluorescent material is low in the region where the inorganic fluorescent material is distributed in a high concentration. The organic fluorescent material like a rare earth complex may undergo change such as decomposition, for example, when put into contact with an inorganic fluorescent material, and is preferably distributed apart from the inorganic fluorescent material as much as possible. According to the light-emitting device of this embodiment, as descried above, the concentration of the inorganic fluorescent material is kept low in the region where the organic fluorescent material is distributed in a high concentration, so that decomposition or the like of the organic fluorescent material can be suppressed and the life of the fluorescent material can be extended.

In addition, the inorganic fluorescent material is accumulated in the vicinity of the excitation light source (light-emitting part), whereby the brightness of light emission from the inorganic fluorescent material can be elevated. On the other hand, the organic fluorescent material is present at the position remote from the excitation light source but since the organic fluorescent material itself does not cause light scattering, reduction in its light emission brightness is not incurred. Also, since the chromatic variation is not large, the color adjustment is facilitated and at the same time, an effect of effectively preventing UV leakage can be expected. Moreover, by the presence of the inorganic fluorescent material between the organic fluorescent material and the excitation light source, the energy such as heat can be shielded and the organic fluorescent material having relatively low durability can be made to less deteriorate due to heat.

One example of the method for producing the light-emitting device of this embodiment is described below.

For example, a silicate-based inorganic fluorescent material (20 wt %) is dispersed in a silicone monomer, and the obtained dispersion is dropped in the recess of an LED device, left standing for 1 hour and after pre-baking at 120° C. for 1 hour, cured by heating at 140° C. for 2 hours to form an inorganic fluorescent layer. Subsequently, the inorganic fluorescent layer surface is dipped in an acetone solution containing 20 wt % of an Eu complex for 1 hour, thereby causing the Eu complex to permeate into the silicone resin. Furthermore, the surface is washed with a solvent, and the residual solvent is removed under heating, whereby an LED device having a gradient in the fluorescent material concentration in the vertical direction is produced.

Figure 2A:
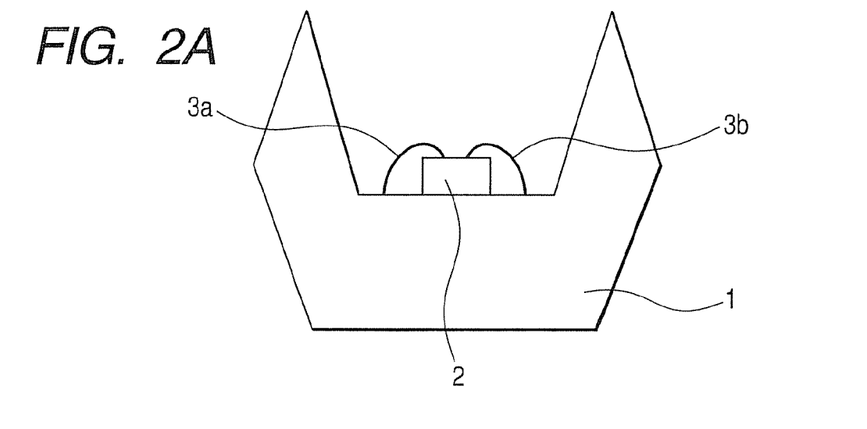
FIGS. 2A to 2C are cross-sectional views of a light-emitting device, showing a method for producing the light-emitting device according to a first exemplary embodiment of the present invention.
Figure 2B:
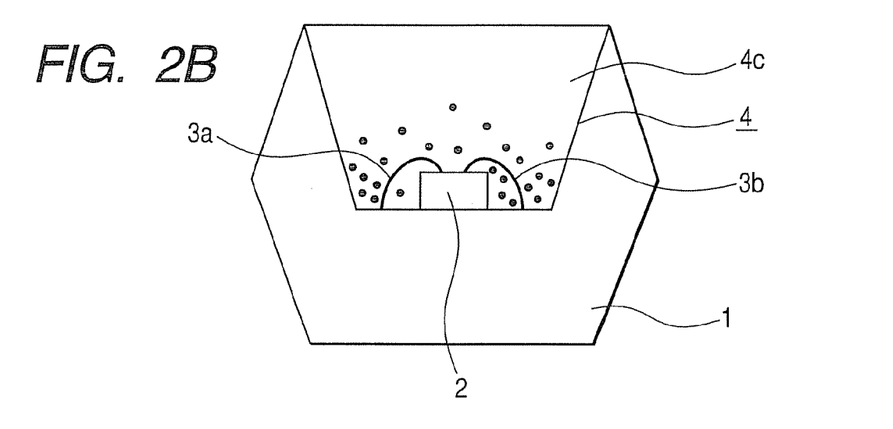
Figure 2C:
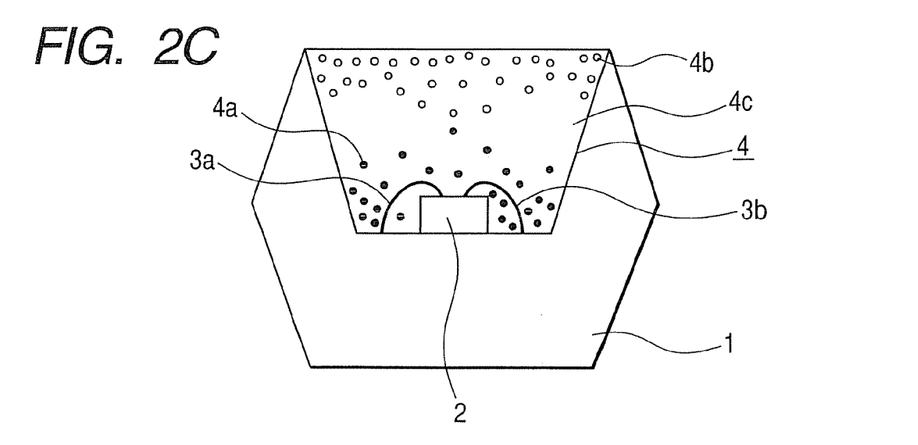

The details will be described with FIGS. 2A to 2C. FIGS. 2A to 2C are process cross-sectional views showing this production method. As shown in FIG. 2A, a near ultraviolet light-emitting LED chip 2 (emission wavelength: 395 nm) is disposed in the recess of a LED frame 1, wires 3a and 3b are provided on a pair of electrodes of the LED chip 2, and the electrodes are electrically connected with respective external connection terminals.

Then, as shown in FIG. 2B, a yellow light-emitting inorganic fluorescent material ($Sr_2SiO_4$:Eu, average particle diameter: about 20 µm, emission wavelength: 540 to 560 nm) and a blue light-emitting inorganic fluorescent material (ZnSe, average particle diameter: about 20 µm, emission wavelength: 450 µnm) are dispersed in a silicone resin raw material, and the entire amount is dropped in the recess of the LED frame 1. After allowing to stand for a predetermined time, for example, from 1 to 24 hours, the resin material is heated and cured by performing a heat treatment, for example, at 100 to 150° C. to form a fluorescent layer 4 having a thickness of 500 µm, where inorganic fluorescent materials 4a (yellow light-emitting inorganic fluorescent material and blue light-emitting inorganic fluorescent material) are dispersed in a silicon resin layer (matrix polymer) 4c. In the process of forming this fluorescent layer 4, since the specific gravity of the inorganic fluorescent material 4a is larger than the specific gravity of the silicone resin raw material, the inorganic fluorescent material 4a precipitates in the silicone resin raw material, as a result, the dispersion concentration of the inorganic fluorescent material 4a in the fluorescent layer 4 can be decreased toward the top from the bottom of the fluorescent layer 4. Incidentally, it is also possible to use the above-described green light-emitting inorganic fluorescent material (for example, $BaMgAl_{10}O_{17}$:Eu, Mn, emission wavelength: 520 nm) in place of the yellow light-emitting inorganic fluorescent material.

Thereafter, as shown in FIG. 2C, an ink containing a rare earth complex as the organic fluorescent material is cast on the top surface of the silicone resin layer 4c, and this ink is caused to permeate into the silicone resin layer 4c. Here, for example, a europium rare earth complex (emission wavelength: near 615 nm) having a structure represented by the following formula (4) is used as the rare earth complex, and the ink is produced by dissolving this rare earth complex in a solvent such as alcohol, acetone and hexane.

Formula (4):

By this step, the ink containing a rare earth complex permeates into the silicone resin layer 4c from the top surface of the resin layer 4c, as a result, the dispersion concentration of the rare earth complex (organic fluorescent material) 4b in the fluorescent layer 4 can be decreased toward the bottom from the top of the fluorescent layer 4. Here, as for the preferred material into which the organic fluorescent material-containing ink is caused to permeate, in addition to the silicone resin, a polymer or the like such as the above-described rubber, elastomer or gel may be used.

In such a polymer, microscopically, the polymer chain is forming a network structure. Therefore, when dipped in a solvent, the polymer swells by absorbing the solvent. Although it may vary depending on the combination of materials, a solution is prepared by dissolving a molecule having a low molecular weight, such as rare earth complex (organic fluorescent material), in a solvent and the polymer is coated with or dipped in this solution, whereby the organic fluorescent material dissolved can be caused to permeate into the polymer and thus, the organic fluorescent material can be taken into the polymer. The polymer preferably has high transparency to light emitted from LED.

After repeating several times the step of causing the organic fluorescent material to permeate into the polymer, the surface of the fluorescent layer 4 is washed with a solvent such as alcohol, acetone and hexane to remove the rare earth complex solution remaining on the surface, and then the solvent is removed by drying. Finally, a moisture-proof layer 5 comprising a fluororesin such as PCTFE, PTFE and PVdF, a ceramic nanoparticle-deposited film or the like is provided on the fluorescent layer 4.

Figure 3:
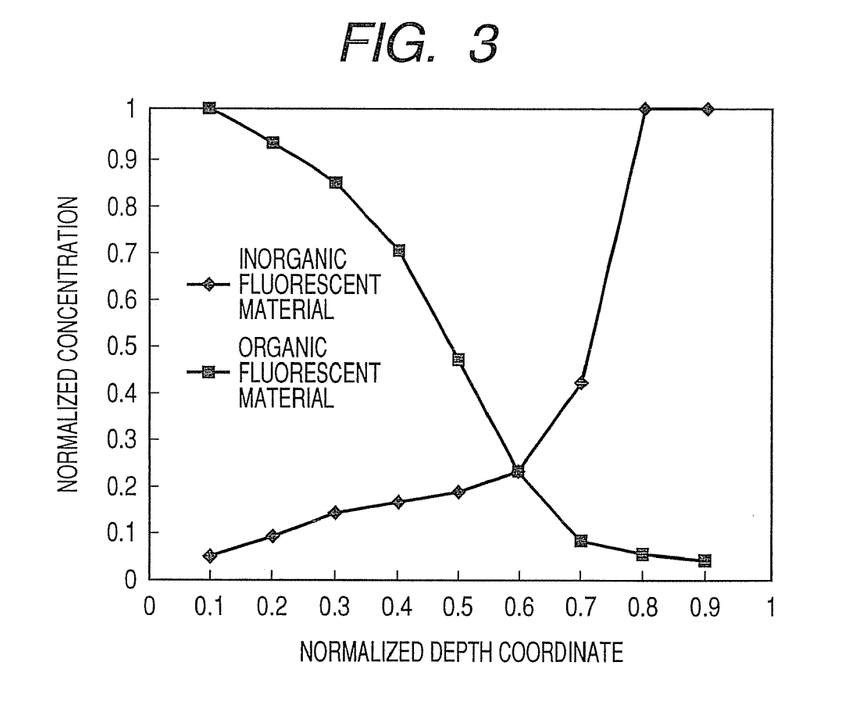
FIG. 3 is a characteristic view showing the concentration distribution of the fluorescent material in the fluorescent layer of a light-emitting device according to a first exemplary first embodiment of the present invention.

With respect to the fluorescent layer 4 produced through these steps, the concentration distributions of the inorganic fluorescent material 4a and the organic fluorescent material 4b in the depth direction are shown in FIG. 3. The Figure shows the concentration distribution of a europium rare earth complex in formula (4) as the organic fluorescent material 4b and the concentration distribution of a yellow light-emitting inorganic fluorescent material ($Sr_2SiO_4$:Eu) as the inorganic fluorescent material 4a. The normalized concentrations on the ordinate are normalized by assuming that the concentration of the organic fluorescent material 4b on the top surface (for example, 5 wt %) of the fluorescent layer 4 and the concentration of the inorganic fluorescent material 4a on the bottom surface (for example, 80%) are 1. Also, the depth coordinate on the abscissa is normalized by assuming that the entire thickness (500 µm) of the fluorescent layer 4 is 1. Incidentally, the concentration distribution of the blue light-emitting inorganic fluorescent material (ZnSe) is similar to the concentration distribution of the yellow light-emitting inorganic fluorescent material and therefore, not shown in the Figure.

As shown in FIG. 3, the abundance ratio of the inorganic fluorescent material 4a is decreased toward the top from the bottom of the fluorescent layer 4 along the thickness direction and on the contrary, the abundance ratio of the organic fluorescent material 4b is decreased toward the bottom from the top of the fluorescent layer 4 along the thickness direction. When the light emission of the thus-produced light-emitting device is measured, satisfactory absorption of excitation light and the resulting light emission are exhibited and the light emission intensity at a wavelength of 450 nm, a wavelength of 540 to 560 nm and a wavelength of 615 nm is sufficiently high. From these, it is seen that the amount of the organic fluorescent material 4b contained by permeation in the silicone resin 4c as well as the amount of the inorganic fluorescent material 4a contained in the silicone resin 4c are sufficiently large.

Also, the durability of the light-emitting device of this embodiment is evaluated, as a result, the brightness retention after a given time is 90% and this reveals that the durability is high as compared with the case of producing the fluorescent layer by homogeneously mixing an inorganic fluorescent material 4a and an organic fluorescent material 4b, where the brightness retention is 75%. The reason therefor is that, as described above, since the concentration of the inorganic fluorescent material is kept low in the region where the organic fluorescent material is distributed in a high concentration, decomposition or the like of the organic fluorescent material can be suppressed and the life of the fluorescent material can be extended. Also, it is considered that small interaction between the rare earth complex (organic fluorescent material 4b) and the silicone resin 4c and less effect on the coordination state of the complex are one of the reasons.

According to the production method of this embodiment, the following effects can be obtained. First, the step of producing a white LED using an inorganic fluorescent material can be utilized as it is by virtue of high affinity for existing production methods, and the coating or dipping step with or in the organic fluorescent material added later is very simple and easy, resulting in less of a necessity to introduce a new large-scale apparatus.

The LED production step sometimes contains a soldering reflow step, and the heat at the time of performing soldering may adversely affect the organic fluorescent material, but since the reflow step requires a short time, the deterioration of the organic fluorescent material can be minimized. A production method involving utterly no exposure to high temperature by performing the step of causing the organic fluorescent material to permeate into the resin, after the soldering treatment may also be employed.

In the conventional production method of a light-emitting device, a polymerization method is used as the method for forming a fluorescent layer. In this method, a step of polymerization under heating needs to be performed after dispersing the fluorescent material in a resin. However, if an organic fluorescent material is dispersed in a resin raw material such as silicone monomer and then polymerization is performed, due to attack by an active species such as silicone radial produced at the polymerization reaction, the organic fluorescent material is deactivated or the polymerization reaction itself is inhibited and the fluorescent layer cannot be formed in a good yield. On the other hand, according to the production method of this embodiment, after polymerizing the polymer, the organic fluorescent material is caused to permeate into the resin by the step such as coating or dipping and therefore, deactivation of the organic fluorescent material or inhibition of the polymerization reaction does not occur.

Second Embodiment

Figure 4:
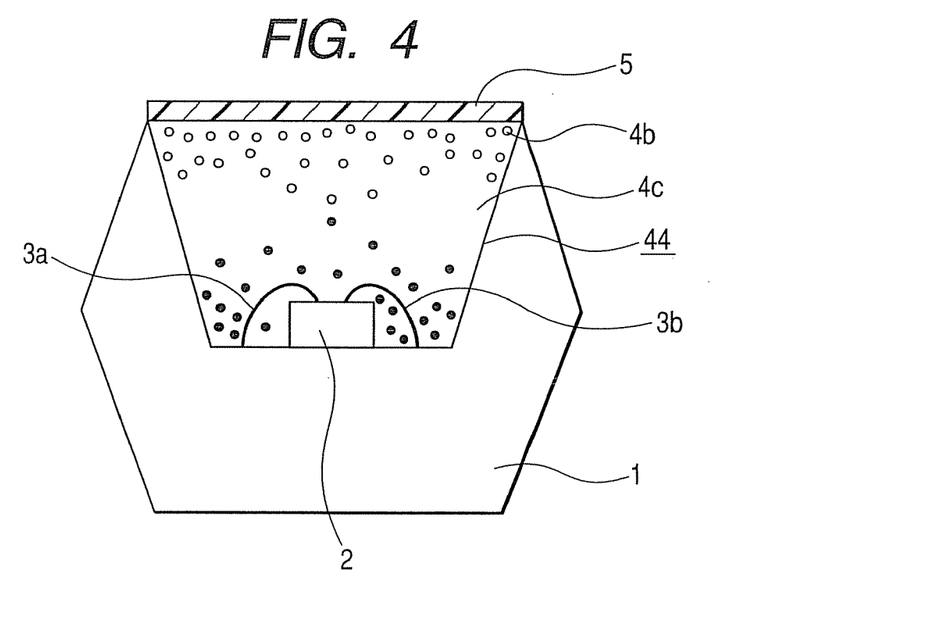
FIG. 4 is a cross-sectional view showing a light-emitting device according to a second exemplary embodiment of the present invention.

In a second exemplary embodiment, a light-emitting device comprising a fluorescent layer not containing an inorganic fluorescent material which is a constructive requirement in the first embodiment, is described. FIG. 4 is a cross-sectional view showing the construction, and the same parts as in FIG. 1 are denoted by the same numerals or symbols.

As shown in FIG. 4, the fluorescent layer 44 of this embodiment has a construction containing the organic fluorescent material 4b (that shown in formula (4)) but not containing the inorganic fluorescent material 4a shown in FIG. 1. The organic fluorescent material 4b in the matrix polymer 4c is dispersed and adjusted so that the abundance ratio can decrease toward the bottom from the top of the fluorescent layer 4 along the thickness direction. A moisture-proof layer 5 is provided at the top of the fluorescent layer 4 and by virtue of this, the moisture resistance can be enhanced. Such a light-emitting device of this embodiment can be produced in the same manner as in the first embodiment.

Figure 5:
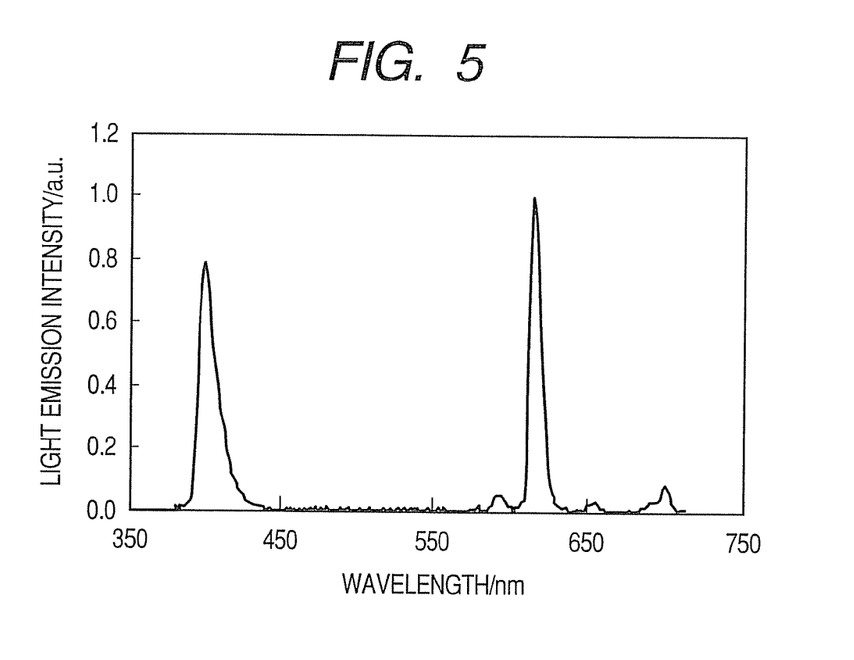
FIG. 5 is a characteristic view showing the light emission spectrum of a light-emitting device according to a second exemplary embodiment of the present invention.

The light-emitting device of this embodiment comprises only an organic fluorescent material 4b, and the organic fluorescent material 4b dispersed as in this embodiment enables to obtain a sufficiently high light emission intensity at the emission wavelength. When the light emission of the light-emitting device of this embodiment is measured, satisfactory absorption of excitation light and the resulting light emission are exhibited, and a light emission spectrum shown in FIG. 5 is obtained, in which the light emission intensity at a wavelength of 615 nm is sufficiently high. From these, it is seen that the amount of the organic fluorescent material 4b contained by permeation in the silicone resin 4c is sufficiently large.

Also, the durability of the light-emitting device of this embodiment is evaluated, as a result, the brightness retention after a given time is 95% and this reveals that the durability is high as compared with the case using Cefral for the fluorescent layer, where the brightness retention is 80%. The reason therefor is considered because the interaction between the rare earth complex (organic fluorescent material 4b) and the silicone resin 4c is small and causes less effect on the coordination state of the complex.

In addition, according to the light-emitting device of this embodiment, similarly to the first embodiment, reduction in the light emission brightness is not incurred and since the chromatic variation is not large, the color adjustment is facilitated and at the same time, an effect of effectively preventing UV leakage can be expected. Furthermore, the organic fluorescent material is largely distributed at the position remote from the excitation light source, so that the effect of energy such as heat can be reduced and the organic fluorescent material having relatively low durability can be made to less deteriorate due to heat.

Also, similarly to the first embodiment, the step of causing the organic fluorescent material to permeate into the resin may be performed after soldering treatment, and the organic fluorescent material or polymer can be prevented from adverse effect of the heating at the time of soldering. In addition, after polymerizing the matrix polymer, the organic fluorescent material is caused to permeate into the resin by the step such as coating or dipping and therefore, deactivation of the organic fluorescent material or inhibition of the polymerization reaction does not occur.

Figure 6:
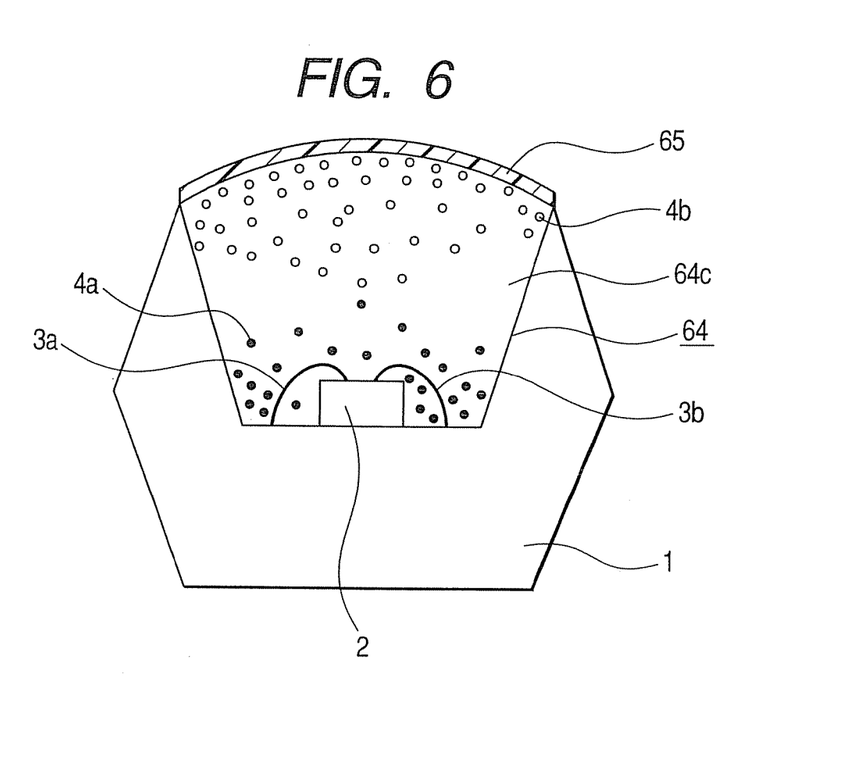
FIG. 6 is a cross-sectional view showing a light-emitting device according to a third exemplary embodiment of the present invention.

As for the rare earth complex in formula (4), even when a trivalent terbium (Tb(III)) is used in place of the trivalent europium (Eu(III)), the same effect as in the above-described embodiment can be obtained, and the light emission intensity at a wavelength of about 545 nm can be made high. In this case, the ink may be produced by dissolving the rare earth complex in a solvent such as alcohol, acetone and hexane. Also, even in the case of using a trivalent iridium (Ir(III)) in place of the trivalent europium (Eu(III)), the same effect as in the above-described embodiment can be obtained, and the light emission intensity can be made sufficiently high Third Embodiment A light-emitting device of a third exemplary embodiment according to the present invention is constructed by causing the head part of the fluorescent layer in the first embodiment to form a lens shape. FIG. 6 is a cross-sectional view showing the structure, and the same parts as in FIG. 1 are denoted by the same numerals or symbols. As shown in FIG. 6, in the light-emitting device of this embodiment, the head part of the matrix polymer 64c constituting the fluorescent layer 64 is convexed and forms a lens shape. The material of the matrix polymer 64c is the same as that in the first embodiment.

The inorganic fluorescent material 4a in the matrix polymer 64c is dispersed and adjusted so that the abundance ratio can decrease toward the top from the bottom of the fluorescent layer 64 along the thickness direction. Also, the organic fluorescent material 4b in the matrix polymer 64c is dispersed and adjusted so that the abundance ratio can decrease toward the bottom from the top of the fluorescent layer 64 along the thickness direction, and the concentration becomes maximum in the vicinity of the head surface of the convex lens-shaped portion. A moisture-proof layer 65 is provided at the top of the fluorescent layer 64 and by virtue of this, the moisture resistance can be enhanced. The material of the moisture-proof layer 5 is the same as that in the first embodiment.

The production method of the light-emitting device of this embodiment is as follows. That is, similarly to the first embodiment, the entire amount of a silicone resin raw material having dispersed therein an inorganic fluorescent material 4a is dropped in the recess of a LED frame 1 to form a silicon resin layer (matrix polymer) 64c. At this time, the resin raw material is dropped in an amount larger than that fit in the inside of the frame 1, whereby the silicone resin layer 64c is formed like a dome. Other steps are the same as in the first embodiment.

Through these steps, the convex lens-shaped portion of the silicone resin layer 64c protruded from the frame 1 can be made transparent. This is because the inorganic fluorescent material 4a precipitates in the silicone resin raw material and this enables to significantly decrease the concentration of the inorganic fluorescent material 4a in the convex lens-shaped portion of the silicone resin layer 64c and suppress the scattering of light by the inorganic fluorescent material 4a. Accordingly, the head part of the silicone resin layer 64c can satisfactorily function as a lens, so that the light condensing property or directivity for light emitted from the LED chip can be enhanced. Also, in this embodiment, when an organic fluorescent material 4b is caused to permeate into this transparent concave lens-shaped portion by coating or dipping, the same effect as in the first embodiment can be obtained. In addition, the organic fluorescent material 4b can be distributed in the concave lens-shaped portion to give the above-described concentration distribution, and the effect as a lens can be enhanced.

Fourth Embodiment

A fourth exemplary embodiment shows another example of the method for coating the organic fluorescent material. The coating of the organic fluorescent material is not limited to dropping of the resin raw material in the above-described embodiments but may be performed by using other methods. For example, in each of those embodiments, a solution having dissolved therein the organic fluorescent material may be coated on the surface of a resin such as silicone resin by printing in an inkjet system or may be coated on the resin surface by using a printing method in a wet electrophotographic system. The solution having dissolved therein the organic fluorescent material is easy to handle, and such a printing method may be applied as it is. The steps other than coating are the same as those in the above-described embodiments. Also by these methods, the concentration distribution of the organic fluorescent material described in the embodiments above can be obtained, and the same effect can be provided. Furthermore, in the coating by printing, the organic fluorescent material can be selectively coated at an arbitrary in-plane position of the resin surface, and the organic fluorescent material can be dispersed with an in-plane pattern, so that a color rendering effect of various modes can be obtained.

Fifth Embodiment

A fifth exemplary embodiment describes application to a security medium. As described in the fourth embodiment, a solution having dissolved therein an organic fluorescent material can be selectively coated at an arbitrary in-plane position of the resin surface by using a printing method in an inkjet system or a wet electrophotographic system, whereby the organic fluorescent material can be dispersed in the resin with a desired in-lane pattern. With use of this method, a security medium of performing recording by forming an organic fluorescent material pattern corresponding to desired security information can be produced.

Figure 7:
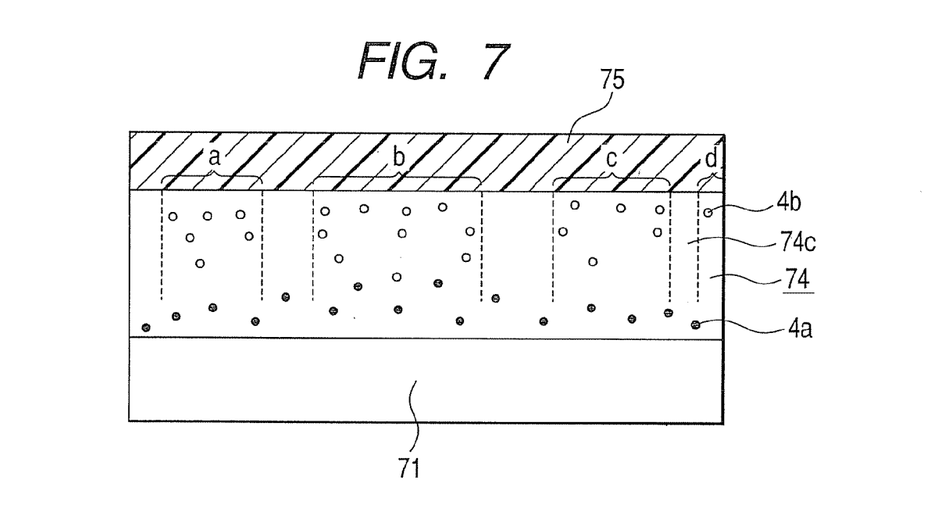
FIG. 7 is a cross-sectional view showing the security medium according to a fifth exemplary embodiment of the present invention.

FIG. 7 is a cross-sectional view showing the construction of the security medium according to this embodiment. As shown in FIG. 7, a fluorescent layer 74 is formed on a substrate 71, and a moisture-proof layer 75 is provided on the fluorescent layer 74. The moisture-proof layer 75 is provided for the purpose of enhancing the moisture resistance of the fluorescent layer 74, and the material therefor is the same as in the first embodiment. The fluorescent layer 74 comprises a matrix polymer 74c having dispersed therein an inorganic fluorescent material 4a and an organic fluorescent material 4b of the first embodiment, and the inorganic fluorescent material 4a is dispersed and adjusted so that the abundance ratio can decrease toward the top from the bottom of the fluorescent layer 74 along the thickness direction. The inorganic fluorescent material 4a may be provided, if desired, and is not necessarily required in the security medium. The organic fluorescent material 4b in the matrix polymer 74c is dispersed and adjusted so that the abundance ratio can decreased toward the bottom from the top of the fluorescent layer 74 along the thickness direction. The material of the matrix polymer 74c is the same as in the first embodiment. The organic fluorescent material 4b in the matrix polymer 74c is selectively distributed in the in-plane regions a, b, c and d each sandwiched by dotted lines in FIG. 7, and these regions are corresponding to the desired security information. The inorganic fluorescent material 4a is uniformly distributed in the plane.

The production method of such a security medium is the same as that in the first embodiment, and the coating of the organic fluorescent material is performed by using a printing method in an inkjet system or a wet electrophotographic system described in the fourth embodiment. By such a printing method, the organic fluorescent material can be selectively coated in the regions corresponding to the in-plane regions a, b, c and d of the matrix polymer 74c, and the organic fluorescent material 4b can be selectively distributed in the in-plane regions a, b, c and d through the same steps as in the first embodiment.

The information recorded in the security medium of this embodiment is read out by using the following method. In the case of containing an inorganic fluorescent material 4a, coloration by the inorganic fluorescent material is sometimes observed on the entire surface of the medium, but in the case of not containing an inorganic fluorescent material 4a, the security medium is substantially transparent to visible light. In either case, the information recorded in the security medium cannot be read out in this state. An ultraviolet ray at a wavelength of 250 to 410 nm is irradiated on the security medium, and the fluorescence emitted from the organic fluorescent material 4b (for example, that shown by formula (4)) distributed in the regions a, b, c and d is read. The readout may be performed with an eye or may be performed by using, if desired, a device for reading fluorescence, such as photodiode. In this way, the information recorded in the security medium can be read out.

According to this embodiment, with respect to the fluorescent layer, the same effect as in the first embodiment can be obtained, and a highly reliable security medium can be provided. In addition, by the combination with a printing technique, a transfer technique or the like, an effect of enabling additional writing of security information can be obtained.

The present invention is not limited to these embodiments. For example, in the embodiments above, a light-emitting chip capable of emitting near ultraviolet light is used, but not only limited to this, a light-emitting chip having an emission wavelength belong to the wavelength region from ultraviolet ray to near infrared, violet blue-violet or blue ray may also be used. For example, a blue light-emitting LED chip (emission wavelength: 450 to 470 μm) may be used in place of the LED chip of the first embodiment and in this case, an inorganic fluorescent material of emitting blue light may be dispensed with. Even in such a case, although the light emission intensity is decreased, the inorganic fluorescent material 4a and the organic fluorescent material 4b of the first embodiment may be caused to emit light and the desired effect can be obtained.

As for the organic fluorescent material, in addition to those described in the embodiments above, a complex having a structure represented by the following formula (5) may also be used. In the complex represented by formula (5), a complex where phosphorus compounds having an asymmetric structure are coordinated to one rare earth element becomes more asymmetric in the ligand field and its light emission intensity remarkably increases based on the enhancement of molecular extinction coefficient. The same tendency applies to the rare earth complex in the above-described embodiments.

Formula (5)

wherein Ln is a rare earth atom (which may be selected from europium, terbium, iridium and erbium); X' and Y', which may be the same or different, each is an atom selected from the group consisting of O, S, and Se (particularly O); $R_1'$ to $R_4'$ each is a group selected from the group consisting of a linear or branched alkyl or alkoxy group having a carbon number of 20 or less (for example, a phenyl group or an alkyl group such as $n$-$C_4F_9$ group, tert-$C_4F_9$ group and n-Oc (octyl) group), a phenyl group, a biphenyl group, a naphthyl group, a heterocyclic group, and a substitution product thereof, and $R_1'$ to $R_4'$ may be the same or different but a structure where these are all not the same (that is, a structure which is asymmetric) is preferred in view of increase in the light emission intensity; n is an integer of 2 to 20 (for example, 3); m and p each is an integer of 1 to 5; Z and W, which may be the same or different, each is a member selected from the group consisting of a hydrogen atom, a deuterium atom, a halogen atom and an alkyl group; $R_7$ and $R_9$, which may be the same or different, each is a group selected from the group consisting f a linear or branched alkyl or alkoxy group, a phenyl group, a biphenyl group, a naphthyl group, a heterocyclic group, and a substitution product thereof; and $R_8$ is a halogen atom, a deuterium atom or a linear or branched aliphatic group having a carbon number of 1 to 22.

In addition, a plurality of species of rare earth complexes may also be used and, for example, by using the organic fluorescent materials described in the embodiments above in combination, the color rendering may be further enhanced.

Furthermore, the present invention is not limited only to the fluorescent layer in the form described in the embodiments above but, for example, after a light-emitting chip as an excitation source is disposed in a mold having an arbitrary shape and a resin raw material such as silicon resin is cast in the mold and cured under heating, coating of or dipping in an organic fluorescent material may be applied. Into the resin raw material, an inorganic fluorescent material may or may not be incorporated. Through such an operation, a light-emitting chip can be buried in the inside of a shaped article having an arbitrary form, and a light-emitting shaped article having various forms and having high color rendering can be produced. It is also possible that a light-emitting chip is not buried in the shaped article but is provided outside the shaped article and light is emitted by irradiating the shaped article from the outside. Such a light-emitting shaped article is rich in the decorative or design property and usable for various uses such as in the interior and for outdoor.

Other than the security medium, the present invention can be applied to a fluorescent pattern-formed material such as design display medium (e.g., advertisement, poster), and its application extends over a wide range.

Figure 8:
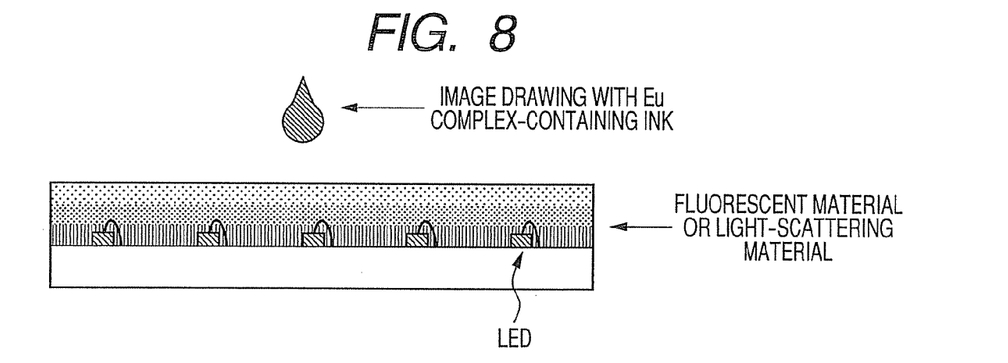
FIG. 8 is a cross-sectional view showing a process of producing a fluorescent pattern-formed device according to an exemplary embodiment of the present invention.

As shown in FIG. 8, a silicone monomer containing an inorganic fluorescent material or a light-scattering fine particle such as silica is coated on an LED array and then cured by heating. Thereafter, an ink containing a rare earth complex (an organic fluorescent material) is coated on the formed silicone layer, for example, by an inkjet or transfer method to draw an image, thereby printing an arbitrary in-plane pattern of the organic fluorescent material. In this way, a fluorescent display panel having an arbitrary in-plane fluorescent pattern can be produced.

Figure 9A:
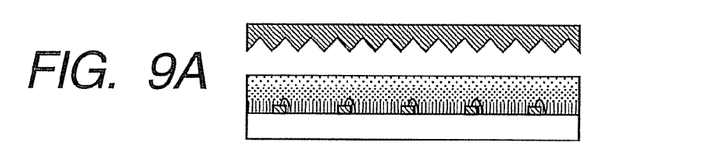
FIGS. 9A to 9C are cross-sectional views of a fluorescent pattern-formed device, showing a method for producing the fluorescent pattern-formed device according to an exemplary embodiment of the present invention.
Figure 9B:
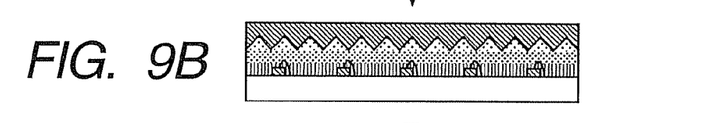
Figure 9C:
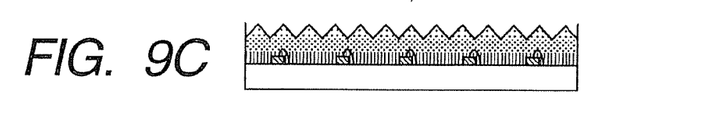

The silicone layer can be imparted with a light-scattering effect by fabricating the surface profile in the nanometer order. As for the surface fabrication method, the coated silicone monomer is cured by heating in the state of a microfabricated substrate being pressed thereon (FIG. 9A), and the microfabricated substrate is then separated (FIG. 9B), whereby a fluorescent display panel having a microfabricated texture can be produced (FIG. 9C). By virtue of this surface texture, light emission with less unevenness can be obtained. The surface texture can be applied in any case of using an inorganic fluorescent material, using a combination with a light-scattering fine particle, or using only either one.

The present invention is not limited to these embodiments or examples, but the constituent elements may be changed or modified in the practical stage within the scope not departing from the spirit of the present invention. Also, by an appropriate combination of a plurality of constituent elements disclosed in the embodiments or examples above, various inventions may be made. For example, some constituent elements may be deleted from the entire constituent element disclosed in the embodiments or examples. Furthermore, constituent elements from different embodiments or examples may also be appropriately combined.

What is claimed is:

1. A light-emitting device comprising:
    a support;
    a light-emitting part; and
    a fluorescent layer consisting essentially of a matrix polymer including an organic fluorescent material and an inorganic fluorescent material, wherein the fluorescent layer in the matrix polymer has a concentration of the inorganic fluorescent material whose abundance ratio is decreased toward an uppermost surface from a lowermost surface of the fluorescent layer along a thickness direction of the fluorescent layer, and the fluorescent layer in the matrix polymer has a concentration of the organic fluorescent material whose abundance ratio is decreased toward the lowermost surface from the uppermost surface of the fluorescent layer along a thickness direction of the fluorescent layer,
    wherein a concentration of the organic fluorescent material in a region of the fluorescent layer within 50 μm from the lowermost surface of the fluorescent layer is 20% or less, excluding 0%, relative to a concentration of the organic fluorescent material in the uppermost surface of the fluorescent layer.

2. The light-emitting device according to claim 1, wherein the matrix polymer is at least one selected from the group consisting of a rubber, an elastomer, and a gel.

3. The light-emitting device according to claim 1, wherein the matrix polymer is a silicone resin.

4. The light-emitting device according to claim 1, wherein the organic fluorescent material is a complex of a rare earth metal element.

5. The light-emitting device according to claim 4, wherein the complex of a rare earth metal element is one selected from the group consisting of an europium complex, a terbium complex, and an iridium complex.

6. The light-emitting device according to claim 1, wherein a concentration of the inorganic fluorescent material in a region of the fluorescent layer within 20% from the uppermost surface with respect to a thickness direction of the fluorescent layer is 20% or less relative to a concentration of the inorganic fluorescent material in the lowermost surface of the fluorescent layer.

7. The light-emitting device according to claim 1, wherein the fluorescent layer has a head part in a lens shape.

* * * * *